(12) United States Patent
Zhang et al.

(10) Patent No.: US 11,664,227 B2
(45) Date of Patent: May 30, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Qian Jiang Zhang, Shanghai (CN); Bo Su, Shanghai (CN); Tao Dou, Shanghai (CN); Lin Lin Sun, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 310 days.

(21) Appl. No.: 17/023,940

(22) Filed: Sep. 17, 2020

(65) Prior Publication Data
US 2021/0090890 A1   Mar. 25, 2021

(30) Foreign Application Priority Data
Sep. 20, 2019   (CN) .......................... 201910892724.4

(51) Int. Cl.
*H01L 21/033* (2006.01)

(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
CPC ............. H01L 21/0332; H01L 21/0335; H01L 21/0337; H01L 21/0338
See application file for complete search history.

(56) References Cited

U.S. PATENT DOCUMENTS

2009/0149024 A1* 6/2009 Huang ................ H01L 21/0337
                                                                 438/670
2013/0015525 A1* 1/2013 Cheng ............ H01L 21/823814
                                                                 257/E21.632
2016/0372325 A1* 12/2016 Posseme ........... H01L 21/31116

* cited by examiner

*Primary Examiner* — Walter H Swanson
(74) *Attorney, Agent, or Firm* — Anova Law Group, PLLC

(57) ABSTRACT

A semiconductor structure and a method for forming the semiconductor structure are provided. The method includes providing a to-be-etched layer; forming an initial mask layer over the to-be-etched layer; forming a patterned structure, on the initial mask layer and exposing a portion of the initial mask layer; forming a barrier layer on a sidewall surface of the patterned structure; using the patterned structure and the barrier layer as a mask, performing an ion doping process on the initial mask layer to form a doped region and an un-doped region between doped regions in the initial mask layer; removing the patterned structure and the barrier layer; and forming a mask layer on a top surface of the to-be-etched layer by removing the un-doped region. The mask layer includes a first opening exposing the top surface of the to-be-etched layer.

19 Claims, 8 Drawing Sheets

SEMICONDUCTOR STRUCTURE AND FABRICATION METHOD THEREOF

CROSS-REFERENCES TO RELATED APPLICATIONS

This application claims the priority of Chinese patent application No. 2019/10892724.4, filed on Sep. 20, 2019, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

In the semiconductor integrated circuit manufacturing process, a semiconductor structure is formed on a semiconductor substrate through a series of processes, such as deposition, photolithography, and etching. The photolithography process is used to form a required pattern in the photoresist, to obtain a patterned photoresist, and to define a to-be-etched region. The etching process is configured to transfer the pattern in the patterned photoresist to the to-be-etched layer.

However, in the existing process of forming the semiconductor structure, the accuracy of pattern transfer needs to be improved. The disclosed methods and device structures are directed to solve one or more problems set forth above and other problems.

BRIEF SUMMARY OF DISCLOSURE

One aspect of the present disclosure includes a method for forming a semiconductor structure, including: providing a to-be-etched layer; forming an initial mask layer over the to-be-etched layer; forming a patterned structure on the initial mask layer and exposing a portion of the initial mask layer; forming a barrier layer on a sidewall surface of the patterned structure; using the patterned structure and the barrier layer as a mask, performing an ion doping process on the initial mask layer to form a doped region and an un-doped region between doped regions in the initial mask layer; removing the patterned structure and the barrier layer; and forming a mask layer on a top surface of the to-be-etched layer by removing the un-doped region. The mask layer includes a first opening exposing the top surface of the to-be-etched layer.

Optionally, the to-be-etched layer includes one of a single-layer structure and a multilayer structure.

Optionally, when the to-be-etched layer includes the multilayer structure, the to-be-etched layer includes a substrate and a dielectric layer on the substrate.

Optionally, the substrate includes a base and a device layer on the base, where the dielectric layer is formed on the device layer.

Optionally, forming the patterned structure includes: forming a patterned layer on the initial mask layer; forming a photoresist layer on the patterned layer; using the photoresist layer as a mask, etching the patterned layer until a portion of a top surface of the initial mask layer is exposed to form the patterned structure; and after forming the patterned structure, removing the photoresist layer.

Optionally, the initial mask layer is made of a material different from the patterned layer.

Optionally, the initial mask layer is made of a material including amorphous silicon, polysilicon, doped silicon, or a combination thereof.

Optionally, a height, of the patterned structure is in a range of approximately 10 nm-30 nm, where a height direction is a direction perpendicular to the top surface of the initial mask layer.

Optionally, forming the barrier layer includes: forming an initial barrier layer on the patterned structure and on the top surface of the exposed initial mask layer; and removing the initial barrier layer on a top surface of the patterned structure and on the top surface of the exposed initial mask layer to form the barrier layer.

Optionally, the barrier layer is made of a material including silicon oxide, silicon nitride, silicon oxynitride, or a combination thereof.

Optionally, forming the initial barrier layer includes an atomic layer deposition process.

Optionally, removing the initial barrier layer on the top surface of the patterned structure and on the top surface of the exposed initial mask layer includes a first wet etching process, where the first wet etching process uses an etching solution including a hydrofluoric acid solution and a hydrogen peroxide solution.

Optionally, a thickness of the barrier layer is in a range of approximately 1 nm-10 nm, where a thickness direction is a direction perpendicular to a sidewall of the patterned structure.

Optionally, doping ions used in the ion doping process include boron ions, phosphorus ions, nitrogen ions, or a combination thereof.

Optionally, parameters of the ion doping process include: doping energy in a range of approximately 10 keV-30 keV, a doping dose in a range of approximately $1\times10^7$ atoms/cm$^2$-$3\times10^7$ atoms/cm$^2$, and a doping duration in a range of approximately 10 s-120 s.

Optionally, removing the patterned structure and the barrier layer includes a second wet etching process, where an etching solution used in the second wet etching process includes a hydrofluoric acid solution and a hydrogen peroxide solution.

Optionally, removing the un-doped region includes a third wet etching process, where an etching solution used in the third wet etching process includes a hydrofluoric acid solution, a hydrogen peroxide solution, and ammonia.

Optionally, after forming the first opening, the method further includes: using the mask layer as a mask, etching the to-be-etched layer to form a second opening in the to-be-etched layer; and after forming the second opening, removing the mask layer.

Another aspect of the present disclosure includes a semiconductor structure formed by the above-disclosed method. The semiconductor structure includes a to-be-etched layer; and a mask layer on the to-be-etched layer, where the mask layer includes a first opening exposing a top surface of the to-be-etched layer.

Optionally, the to-be-etched layer includes one of a single-layer structure and a multilayer structure.

The disclosed embodiments may have following beneficial effects. In the disclosed embodiments of the present disclosure, the barrier layer may be formed on the sidewall surface of the patterned structure. The barrier layer may have strong blocking performance, may effectively block the doping ions from entering the sidewall of the patterned structure, and may further prevent the doping ions from diffusing into the un-doped region to reduce the area of the un-doped region. The barrier layer may effectively improve the consistency between the un-doped region and the patterned structure, thereby improving the accuracy of pattern transfer.

In addition, in the disclosed embodiments, the height of the patterned structure may be in a range of approximately 10 nm-30 nm. If the height of the patterned structure is too low, the doping ions may diffuse from the top surface of the patterned structure into the un-doped region. If the height of the patterned structure is too high, the patterned structure may tend to be collapsed. The patterned structure in such height range may prevent the above issues.

Moreover, in the disclosed embodiments, the thickness of the barrier layer may be in a range of approximately 1 nm-10 nm. If the thickness of the barrier layer is too small, the doping ions may penetrate through the barrier layer to enter the sidewall the patterned structure. If the thickness of the barrier layer is too large, resources may be wasted and the production efficiency may be reduced. The barrier layer in such thickness range may prevent the above issues.

Further, in the disclosed embodiments, the parameters of the ion doping process may include: doping energy in a range of approximately 10 keV-30 keV, the doping dose in a range of approximately $1\times10^7$ atoms/cm$^2$-$3\times10^7$ atoms/cm$^2$, and a doping duration in a range of approximately 30 s-120 s. The ion doping process with parameters in such range may ensure that the doped region is fully ion-doped, which may prevent the topography of the first opening from being affected due to the inadequate doping of the doped region.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
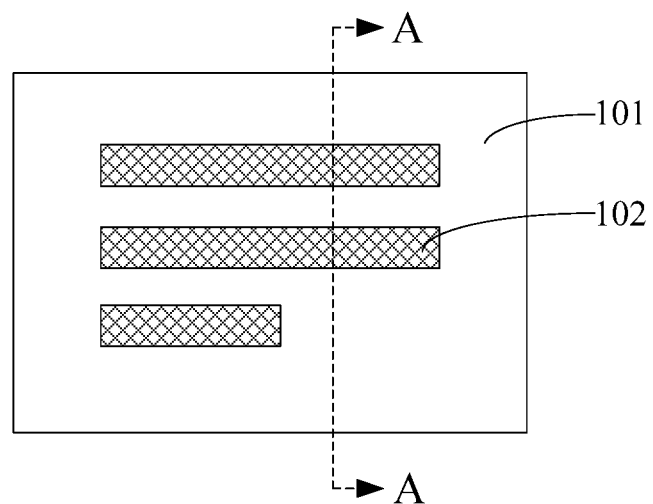
FIGS. 1-4 illustrate semiconductor structures corresponding to certain stages for forming a semiconductor structure.
Figure 2:
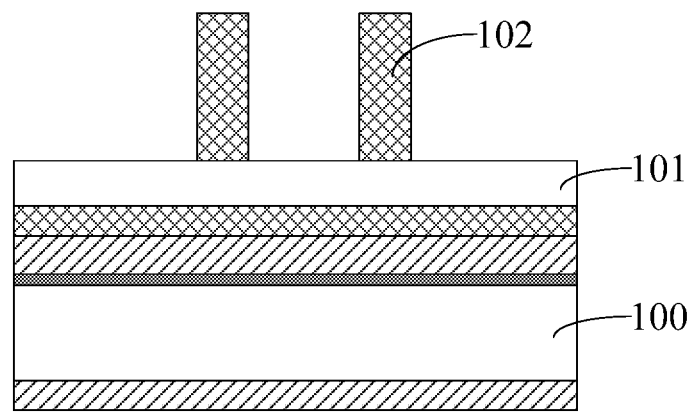

FIGS. 1-4 illustrate semiconductor structures corresponding to certain stages for forming a semiconductor structure. Referring to FIGS. 1-2, FIG. 2 illustrates a schematic A-A sectional view of the structure in FIG. 1. As shown, a to-be-etched layer 100 is provided, and an initial mask layer 101 is formed on the to-be-etched layer 100. A patterned structure 102 exposing a portion of the initial mask layer 101 is formed on the initial mask layer 101.

Figure 3:
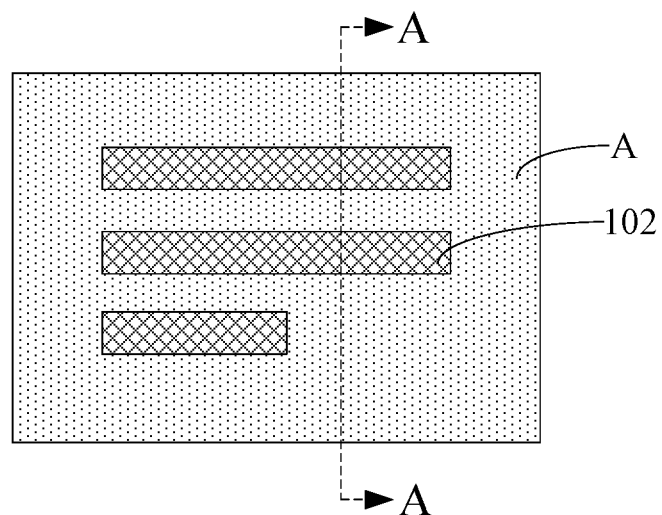
Figure 4:
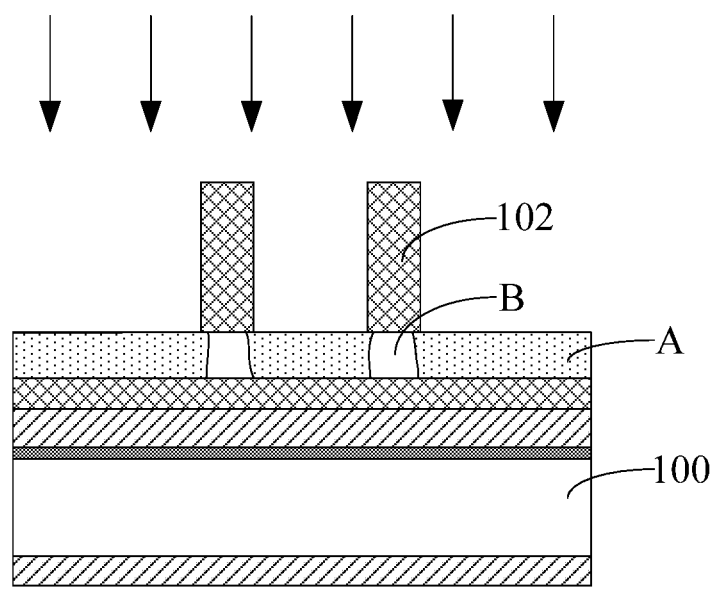

FIG. 4 illustrates a schematic A-A sectional view of the structure in FIG. 3. Referring to FIG. 3 and FIG. 4, an ion-doping process is performed on the initial mask layer 101 using the patterned structure 102 as a mask to form a mask layer (not illustrated). The mask layer includes a doped region A and an un-doped region B.

In the above method, the mask layer is formed by performing an ion doping process on the initial mask layer 101. The mask layer includes the doped region A and the un-doped region B. Ideally, a partial region of the mask layer covered by the patterned structure 102 is the un-doped region B. A wet etching process is subsequently performed on the mask layer. Because the etch selectivity of the etching solution on the doped region A and the un-doped region B are different, the un-doped region B is selectively removed by etching, to achieve the pattern transfer.

However, in actual operation, a portion of the implanted doping ions are implanted into the sidewall of the patterned structure 102. Because the sidewall of the patterned structure 102 is substantially close to the un-doped region B, a portion of the doping ions diffuse into the un-doped region B, which causes the un-doped region B to become smaller and the doped region A to become larger. Then, when etching the mask layer, compared with the patterned structure 102, the formed opening pattern is smaller, and the accuracy of the pattern transfer is reduced.

The present disclosure provides a semiconductor structure and a fabrication method thereof. A barrier layer may be formed on a sidewall surface of the patterned structure. The barrier layer may effectively block doping ions from entering the sidewall of the patterned structure, and then may prevent the doping ions from diffusing into the un-doped region, which may improve the consistency between the un-doped region and the patterned structure, thereby improving the accuracy of pattern transfer.

Figure 20:
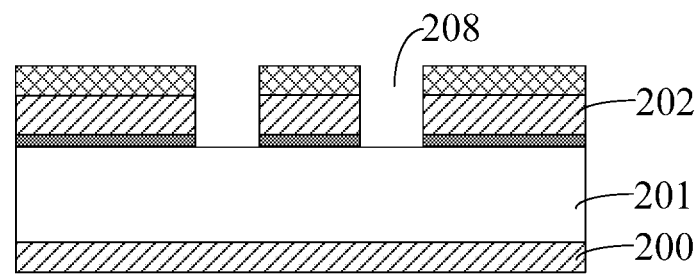
Figure 21:
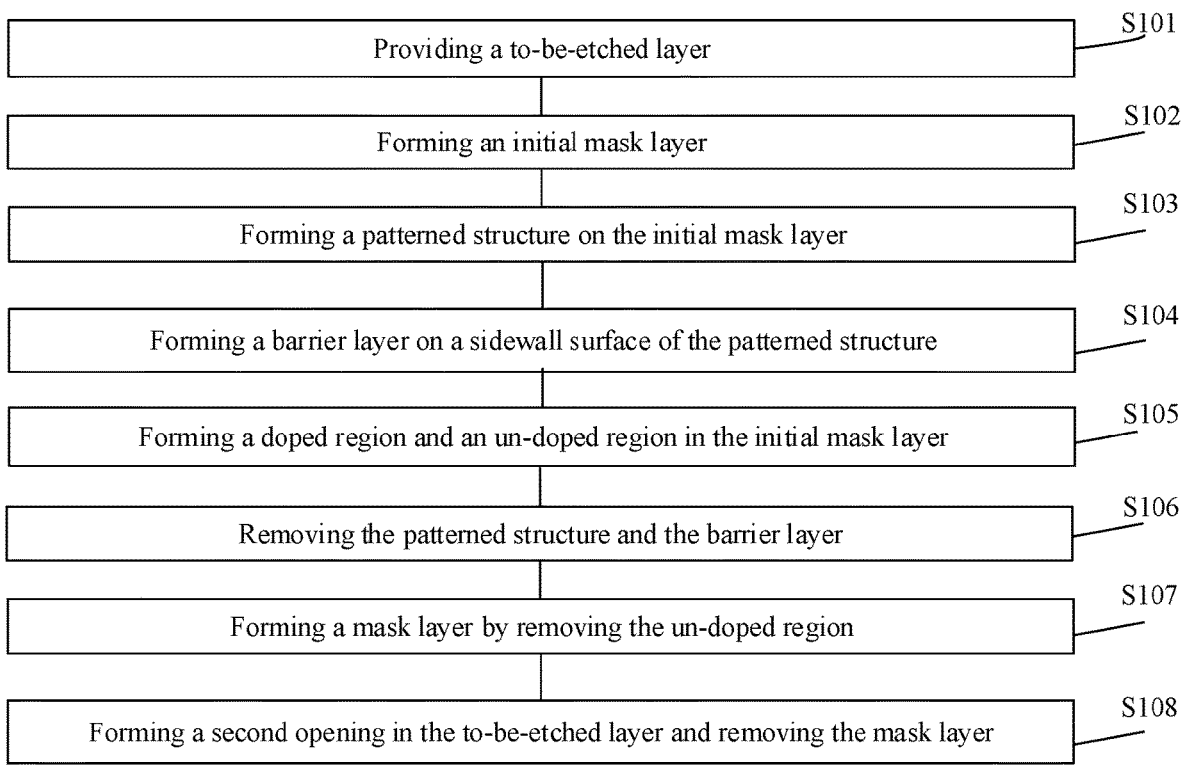
FIG. 21 illustrates a flowchart of an exemplary method for forming a semiconductor structure consistent with various disclosed embodiments of the present disclosure.

FIG. 21 illustrates a flowchart of a method for forming a semiconductor structure consistent with various disclosed embodiments of the present disclosure, and FIGS. 5-20 illustrate semiconductor structures corresponding to certain stages of the fabrication method.

Figure 5:
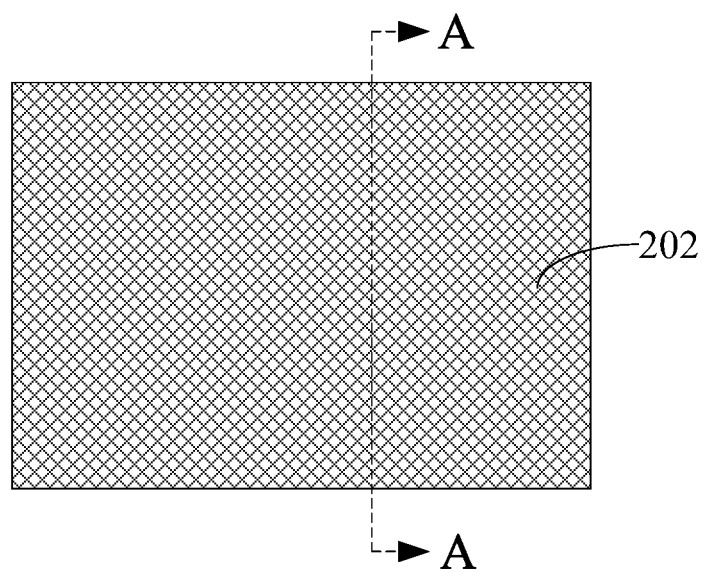
FIGS. 5-20 illustrate semiconductor structures corresponding to certain stages for forming an exemplary semiconductor structure consistent with various disclosed embodiments of the present disclosure.
Figure 6:
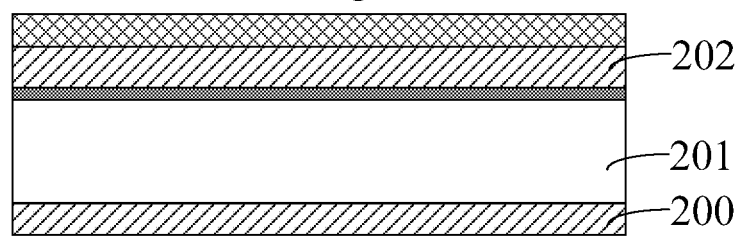

As shown in FIG. 21, at the beginning of the fabrication method, a to-be-etched layer may be provided (S101). FIGS. 5-6 illustrate a corresponding semiconductor structure, and FIG. 6 illustrates a schematic A-A sectional view of the structure in FIG. 5.

Referring to FIG. 5 and FIG. 6, a to-be-etched layer may be provided. In one embodiment, the to-be-etched layer may include a multilayer structure. The to-be-etched layer may include a substrate and a dielectric layer 202 over the substrate. In certain embodiments, the to-be-etched layer may include a single-layer structure.

The substrate may include a base 200 and a device layer 201 on the base 200. In one embodiment, the base 200 may be made of silicon. In another embodiment, the base may be made of germanium, silicon germanium, silicon carbide, gallium arsenide, indium gallium, or a combination thereof. In certain embodiments, the base may be a silicon-on-insulator substrate, a germanium-on-insulator or substrate, or a combination thereof.

The device layer 201 may include a device structure, an electrical interconnection structure electrically connected to the device structure, and a device dielectric layer (not illustrated) surrounding the device structure and the electrical interconnection structure. The device structure may include one or more of a PMOS transistor, an NMOS transistor, a CMOS transistor, a resistor, a capacitor, and an inductor.

The electrical interconnection structure may include a conductive plug formed on the surface of the base 200 or on the surface of the device structure, and a conductive layer thrilled on the top of the conductive plug. The conductive layer may be configured to achieve electrical connection between conductive plugs.

The electrical interconnection structure may be made of a material including a metal, or a metal compound, e.g., one or more of copper, tungsten, aluminum, titanium, nickel, titanium nitride, and tantalum nitride. The device dielectric layer may be made of silicon oxide, silicon nitride, silicon carbide, silicon oxynitride, or a combination thereof.

In one embodiment, the dielectric layer 202 may be disposed on the device layer 201, and the dielectric layer 202 may include a multilayer structure. In certain embodiments, the dielectric layer may include a single-layer structure.

Figure 7:
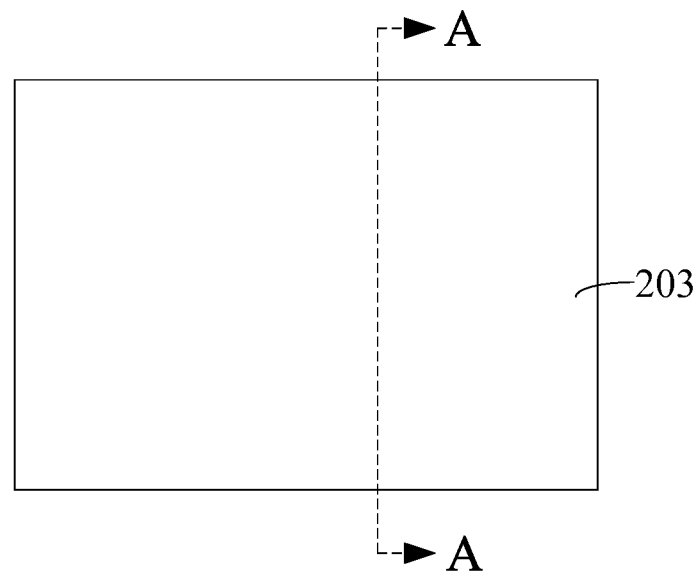
Figure 8:
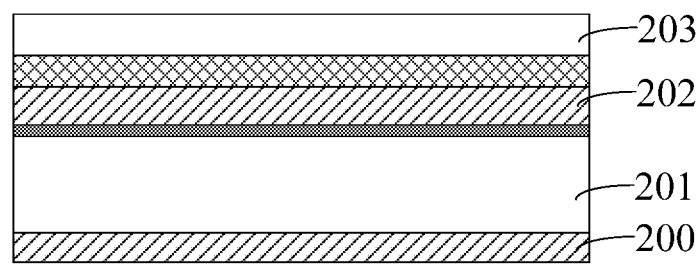

Returning to FIG. 21, after providing the to-be-etched layer, an initial mask layer may be formed (S102). FIGS. 7-8 illustrate a corresponding semiconductor structure, and FIG. 8 illustrates a schematic A-A sectional view of the structure in FIG. 7.

Referring to FIG. 7 and FIG. 8, an initial mask layer 203 may be formed on the to-be-etched layer. The initial mask layer 203 may serve as a mask for subsequently forming a second opening in the to-be-etched layer.

In one embodiment, the initial mask layer 203 may be made of amorphous silicon. In certain embodiments, the initial mask layer may be made of polysilicon, doped silicon, or a combination thereof.

Figure 9:
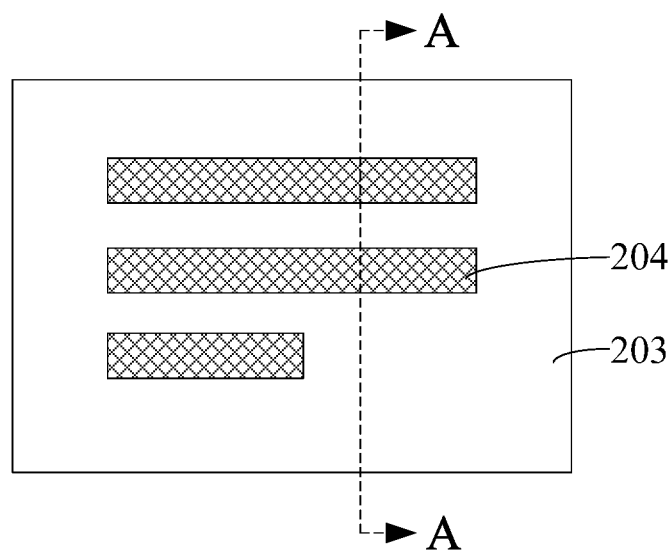
Figure 10:
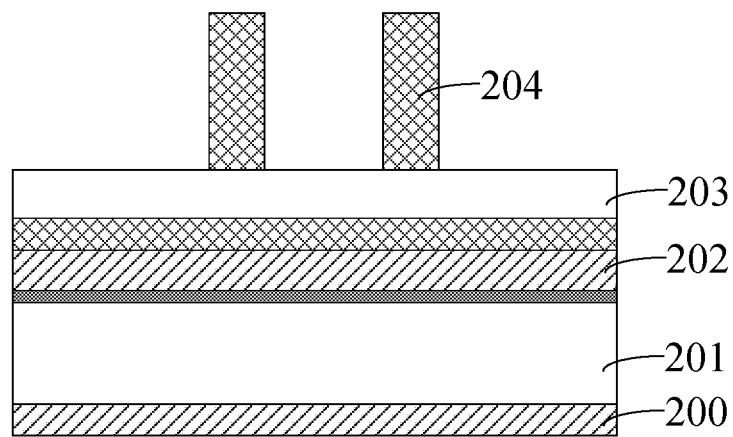

Returning to FIG. 1, after forming the initial mask layer, a patterned structure may be formed (S103). FIGS. 9-10 illustrate a corresponding semiconductor structure, and FIG. 10 illustrates a schematic A-A sectional view of the structure in FIG. 9.

Referring to FIG. 9 and FIG. 10, a patterned structure 204 exposing a portion of the initial mask layer 203 may be formed on the initial mask layer 203. In one embodiment, the method for forming the patterned structure 204 may include: forming a patterned layer on the surface of the initial mask layer 203; forming a photoresist layer on the surface of the patterned layer; using the photoresist layer as a mask, etching the patterned layer until a top surface of the initial mask layer is exposed to form the patterned structure; and after forming the patterned structure, removing the photoresist layer (not illustrated).

In one embodiment, the initial mask layer 203 may be made of a material different from the patterned layer. When etching the patterned layer, the etch selectivity of the etching solution on the initial mask layer may be substantially different from the etch selectivity of the etching solution on the patterned layer, to prevent the initial mask layer 203 from being damaged.

The process for forming the photoresist layer may include a photolithography patterning process. The process of removing the patterned layer may include a wet stripping process, an ashing process, or a combination thereof. The gas of the ashing process may include oxygen-containing gas, e.g., oxygen, ozone, or a combination thereof.

In one embodiment, a height of the formed patterned structure 204 may be in a range of approximately 10 nm-30 nm. The height direction may be a direction perpendicular to the top surface of the initial mask layer 203. If the height of the patterned structure 204 is too low, when subsequently performing the ion doping process, the doping ions may diffuse from the top surface of the patterned structure 204 into the un-doped region, thereby affecting the accuracy of pattern transfer. If the height of the patterned structure 204 is too high, the patterned structure 204 may tend to be collapsed. The patterned structure 204 in such height range may prevent the above issues.

Figure 11:
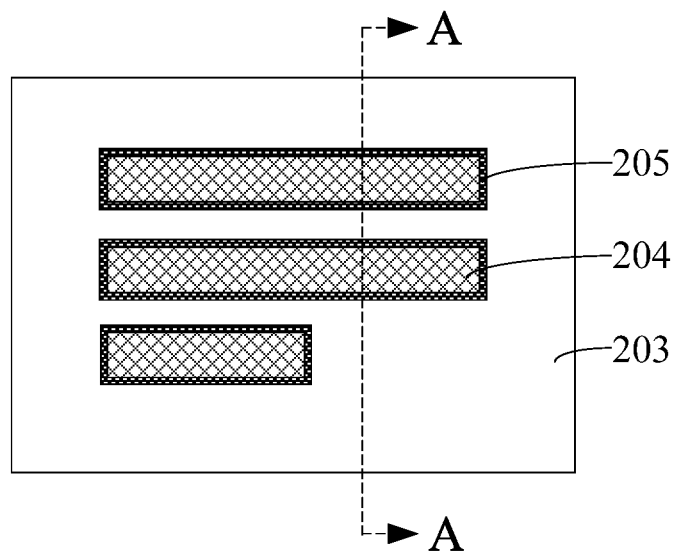
Figure 12:
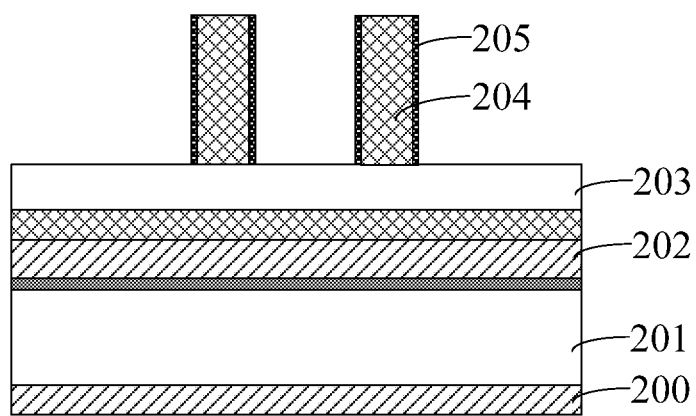

Returning to FIG. 21, after forming the patterned structure, a barrier layer may be formed (S104). FIGS. 11-12 illustrate a corresponding semiconductor structure, and FIG. 12 illustrates a schematic A-A sectional view of the structure in FIG. 11.

Referring to FIG. 11 and FIG. 12, a barrier layer 205 may be formed on a sidewall surface of the patterned structure 204. In one embodiment, forming the barrier layer 205 may include: forming an initial barrier layer (not illustrated) on the surface of the patterned structure 204 and on the top surface of the exposed initial mask layer 203; and removing the initial barrier layer on the top surface of the patterned structure 204 and on the top surface of the exposed initial mask layer 203 to form the barrier layer 205.

The barrier layer 205 may be formed on the sidewall surface of the patterned structure 204. The barrier layer 205 may have strong blocking performance, during the subsequent ion doping process, may electively block the doping ions from entering the sidewall of the patterned structure 204, and may further prevent the doping ions from diffusing into the un-doped region to reduce the area of the un-doped region. The barrier layer 205 may effectively improve the consistency between the un-doped region and the patterned structure, thereby improving the accuracy of pattern transfer.

The barrier layer 205 may have a strong hardness, which may prevent the doping ions from penetrating through the barrier layer to enter the sidewall of the patterned structure 204. The barrier layer 205 may be capable of being cleaned and removed. After performing the ion doping process, the barrier layer 205 and the patterned structure 204 may need to be removed, such that subsequent pattern transfer may be achieved.

In one embodiment, the barrier layer 205 may be made of silicon oxide. In another embodiment, the barrier layer may be made of silicon nitride, silicon oxynitride, or a combination thereof.

In one embodiment, the initial barrier layer may be formed by an atomic layer deposition process. The initial barrier layer formed by the atomic layer deposition process may have desired uniformity, step coverage and controlled thickness.

Because an ion doping process needs to be subsequently performed on the initial mask layer 203, the initial barrier layer on the top surface of the initial mask layer 203 may need to be removed.

In one embodiment, removing the initial barrier layer on the top surface of the patterned structure 204 and on the top surface of the initial mask layer 203 may include a first wet etching process. The first wet etching process may use an etching solution including hydrofluoric acid solution and hydrogen peroxide solution.

In one embodiment, a thickness of the barrier layer 205 may be in a range of approximately 1 nm-10 nm, and the thickness direction may be a direction perpendicular to the sidewall of the patterned structure 204. If the thickness of the barrier layer 205 is too small, when subsequently performing the ion doping process, the doping ions may penetrate through the barrier layer 205 to enter the sidewall of the patterned structure 204. If the thickness of the barrier layer 205 is too large, resources may be wasted and the production efficiency may be reduced. The barrier layer in such thickness range may prevent the above issues.

Figure 13:
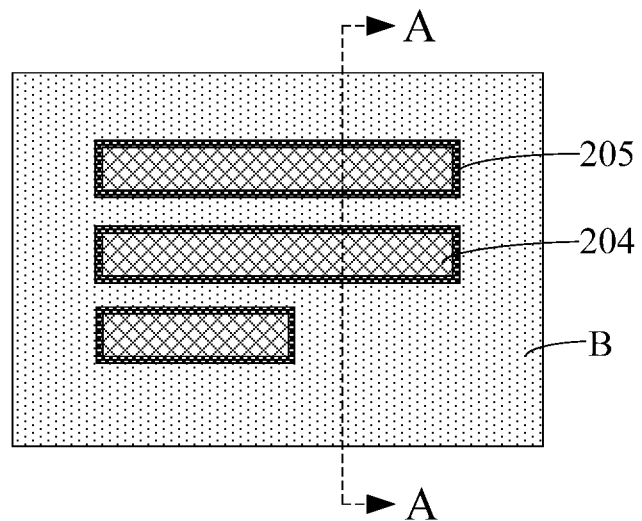
Figure 14:
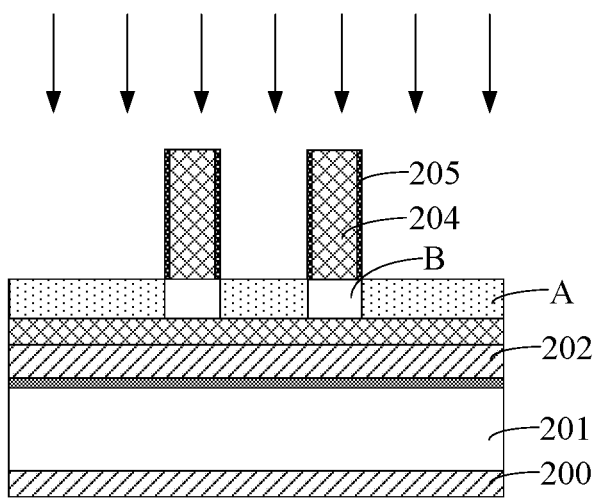

Returning to FIG. 21, after forming the barrier layer, a doped region and an un-doped region may be formed (S105). FIGS. 13-14 illustrate a corresponding semiconductor structure, and FIG. 14 illustrates a schematic A-A sectional view of the structure in FIG. 13.

Referring to FIG. 13 and FIG. 14, using the patterned structure 204 and the barrier layer 205 as a mask, an ion doping process may be performed on the initial mask layer 203 to form a doped region A and an un-doped region B between doped regions A in the initial mask layer 203.

The doped region A and the un-doped region B may be formed in the initial mask layer 203 by the ion doping process. When subsequently etching the un-doped region B, the etch selectivity of the etching solution on the un-doped region B may be substantially larger than the etch selectivity of the etching solution on the doped region A. When the un-doped region B is subsequently removed by etching, the doped region A may be prevented from being damaged to ensure accuracy of pattern transfer.

In one embodiment, the doping ions used in the ion doping process may include boron ions. In certain embodiments, the doping ions may include phosphorus ions, nitrogen ions, or a combination thereof.

In one embodiment, parameters of the ion doping process may include: doping energy in a range of approximately 10 keV-30 keV, a doping dose in a range of approximately $1\times10^7$ atoms/cm$^2$-$3\times10^7$ atoms/cm$^2$, and a doping duration in a range of approximately 30 s-120 s.

The ion doping process with parameters in such range may ensure that the doped region A is fully ion-doped, which may prevent the topography of the first opening from being affected due to the inadequate doping of the doped region A.

Figure 15:
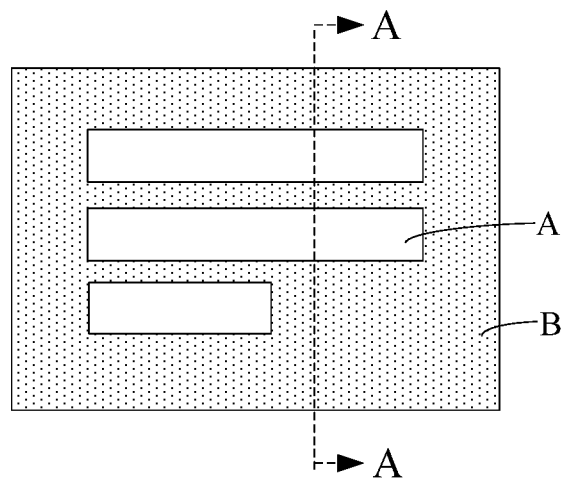
Figure 16:
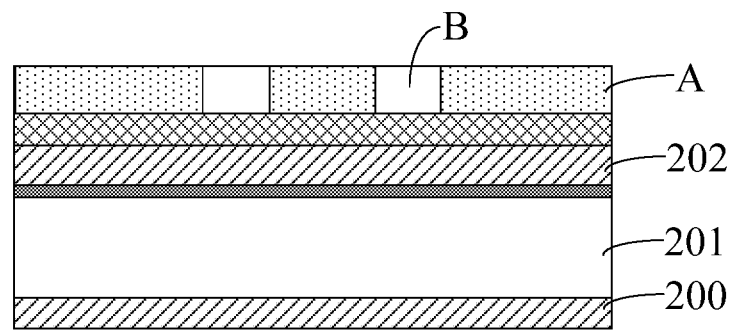

Returning to FIG. 21, after forming the doped region and the un-doped region, the patterned structure and the barrier layer may be removed (S106). FIGS. 15-16 illustrate a corresponding semiconductor structure, and FIG. 16 illustrates a schematic A-A sectional view of the structure in FIG. 15.

Referring to FIG. 15 and FIG. 16, the patterned structure 204 and the barrier layer 205 may be removed. By removing, the patterned structure 204 and the barrier layer 205, the top surface of the un-doped region B may be exposed, and then the un-doped region B may be subsequently removed by etching to achieve the pattern transfer from the patterned structure 204 to the initial mask layer 203.

In one embodiment, removing the patterned structure 204 and the barrier layer 205 may include a second wet etching process. An etching solution used in the second wet etching process mays include a hydrofluoric acid solution and hydrogen peroxide solution.

Figure 17:
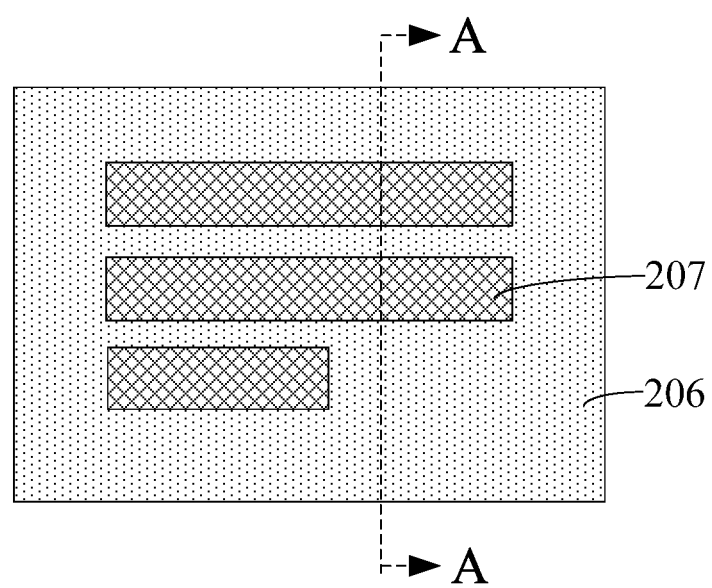
Figure 18:
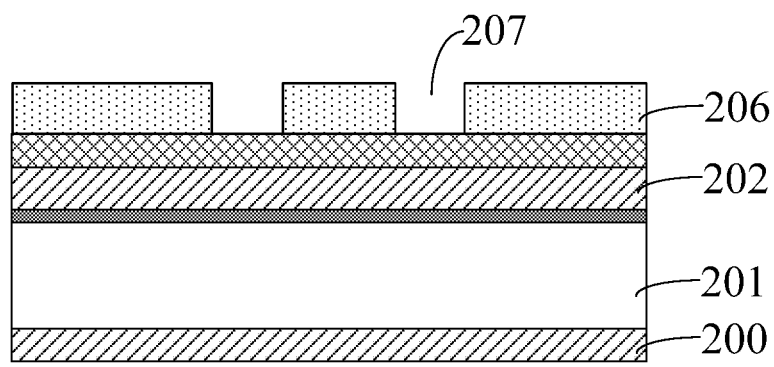

Returning to FIG. 21, after removing the patterned structure and the barrier layer, a mask layer may be formed (S107). FIGS. 17-18 illustrate a corresponding semiconductor structure, and FIG. 18 illustrates a schematic A-A sectional view of the structure in FIG. 17.

Referring to FIG. 17 and FIG. 18, after removing the patterned structure 204 and the barrier layer 205, the un-doped region B may be removed to form a mask layer 206 on the surface of the to-be-etched layer. The mask layer 206 may include a first opening 207 exposing the top surface of the to-be-etched layer.

The topography of the first opening 207 may be obtained by performing a pattern transfer according to the patterned structure 204 and the barrier layer 205.

In one embodiment, removing the un-doped region B may include a third wet etching process. An etching solution used in the third wet etching process may include a hydrofluoric acid solution, a hydrogen peroxide solution, and ammonia.

Figure 19:
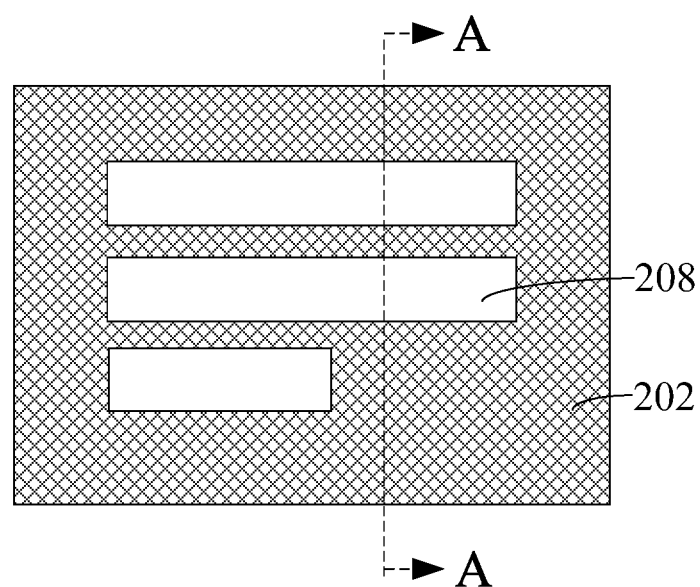

Returning to FIG. 21, after forming the mask layer, a second opening may be formed and the mask layer may be removed (S108). FIGS. 19-20 illustrate a corresponding semiconductor structure, and FIG. 20 illustrates a schematic A-A sectional view of the structure in FIG. 19.

Referring to FIG. 19 and FIG. 20, after forming the first opening 207, using the mask layer 206 as a mask, the to-be-etched layer may be etched to form a second opening 208 in the to-be-etched layer. After forming the second opening 208, the mask layer 206 may be removed.

In one embodiment, the second opening 208 may expose the top surface of the device layer 201. The second opening 208 may be located in the dielectric layer 202, and may be configured to form a conductive plug structure for electrical connection between the device structure in the device layer 201 and an external circuit.

Correspondingly, the present disclosure also provides a semiconductor structure. Referring to FIG. 17 and FIG. 18, the semiconductor structure may be formed by the above-disclosed method. The semiconductor structure may include a to-be-etched layer, and a mask layer 206 on the to-be-etched layer. The mask layer 206 may include a first opening 207 exposing the top surface of the to-be-etched layer.

The disclosed embodiments may have following beneficial effects. In the disclosed embodiments of the present disclosure, the barrier layer may be formed on the sidewall surface of the patterned structure. The barrier layer may have strong blocking performance, may effectively block the doping ions from entering the sidewall of the patterned structure, and may further prevent the doping ions from diffusing into the un-doped region to reduce the area of the un-doped region. The barrier layer may effectively improve the consistency between the un-doped region and the patterned structure, thereby improving the accuracy of pattern transfer.

In addition, in the disclosed embodiments, the height of the patterned structure may be in a range of approximately 10 nm-30 nm. If the height of the patterned structure is too low, the doping ions may diffuse from the top surface of the patterned structure into the un-doped region. If the height of the patented structure is too high, the patterned structure may tend to be collapsed. The patterned structure in such height range may prevent the above issues.

Moreover, in the disclosed embodiments, the thickness of the barrier layer may be in a range of approximately 1 nm-10 nm. If the thickness of the barrier layer is too small, the doping ions may penetrate through the barrier layer to enter the sidewall of the patterned structure. If the thickness of the barrier layer is too large, resources may be wasted and the production efficiency may be reduced. The barrier layer in such thickness range may prevent the above issues.

Further, the disclosed embodiments, the parameters of the ion doping process may include: doping energy in a range of approximately 10 keV-30 keV, the doping dose in a range of approximately $1\times10^7$ atoms/cm$^2$-$3\times10^7$ atoms/cm$^2$, and a doping duration in a range of approximately 30 s-120 s. The ion doping process with parameters in such range may ensure that the doped region is fully ion-doped, which may prevent the topography of the first opening from being affected due to the inadequate doping of the doped region.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor device, comprising:
providing a to-be-etched layer;
forming an initial mask layer over the to-be-etched layer;
forming a patterned structure on the initial mask layer and exposing a portion of the initial mask layer;
forming a barrier layer on a sidewall surface of the patterned structure, including:
forming an initial barrier layer on the patterned structure and on a top surface of the exposed initial mask layer; and
removing the initial barrier layer on a top surface of the patterned structure and on the top surface of the exposed initial mask layer to form the barrier layer;
using the patterned structure and the barrier layer as a mask, performing an ion doping process on the initial mask layer to form a doped region and an un-doped region between doped regions in the initial mask layer;
removing the patterned structure and the barrier layer; and
forming a mask layer on a top surface of the to-be-etched layer by removing the un-doped region, wherein the mask layer includes a first opening exposing the top surface of the to-be-etched layer.

2. The method according to claim 1, wherein:
the to-be-etched layer includes one of a single-layer structure and a multilayer structure.

3. The method according to claim 2, wherein:
when the to-be-etched layer includes the multilayer structure, the to-be-etched layer includes a substrate and a dielectric layer on the substrate.

4. The method according to claim 3, wherein:
the substrate includes a base and a device layer on the base, wherein the dielectric layer is formed on the device layer.

5. The method according to claim 1, wherein forming the patterned structure includes:
forming a patterned layer on the initial mask layer;
forming a photoresist layer on the patterned layer;
using the photoresist layer as a mask, etching the patterned layer until a portion of a top surface of the initial mask layer is exposed to form the patterned structure; and
after forming the patterned structure, removing the photoresist layer.

6. The method according to claim 5, wherein:
the initial mask layer is made of a material different from the patterned layer.

7. The method according to claim 6, wherein:
the initial mask layer is made of a material including amorphous silicon, polysilicon, doped silicon, or a combination thereof.

8. The method according to claim 1, wherein:
a height of the patterned structure is in a range of approximately 10 nm-30 nm, wherein a height direction is a direction perpendicular to a top surface of the initial mask layer.

9. The method according to claim 1, wherein:
the barrier layer is made of a material including silicon oxide, silicon nitride, silicon oxynitride, or a combination thereof.

10. The method according to claim 1, wherein:
forming the initial barrier layer includes an atomic layer deposition process.

11. The method according to claim 1, wherein:
removing the initial barrier layer on the top surface of the patterned structure and on the top surface of the exposed initial mask layer includes a first wet etching process, wherein the first wet etching process uses an etching solution including a hydrofluoric acid solution and a hydrogen peroxide solution.

12. The method according to claim 1, wherein:
a thickness of the barrier layer is in a range of approximately 1 nm-10 nm, wherein a thickness direction is a direction perpendicular to a sidewall of the patterned structure.

13. The method according to claim 1, wherein:
doping ions used in the ion doping process include boron ions, phosphorus ions, nitrogen ions, or a combination thereof.

14. The method according to claim 1, wherein parameters of the ion doping process include:
doping energy in a range of approximately 10 keV-30 keV,
a doping dose in a range of approximately $1 \times 10^7$ atoms/$cm^2$-$3 \times 10^7$ atoms/$cm^2$, and
a doping duration in a range of approximately 30 s-120 s.

15. The method according to claim 1, wherein:
removing the patterned structure and the barrier layer includes a second wet etching process, wherein an etching solution used in the second wet etching process includes a hydrofluoric acid solution and a hydrogen peroxide solution.

16. The method according to claim 1, wherein:
removing the un-doped region includes a third wet etching process, wherein an etching solution used in the third wet etching process includes a hydrofluoric acid solution, a hydrogen peroxide solution, and ammonia.

17. The method according to claim 1, after forming the first opening, further including:
using the mask layer as a mask, etching the to-be-etched layer to form a second opening in the to-be-etched layer; and
after forming the second opening, removing the mask layer.

18. A semiconductor structure, formed by the method according to claim 1, wherein the semiconductor structure includes:
the to-be-etched layer; and
the mask layer on the to-be-etched layer, wherein the mask layer includes the first opening exposing the top surface of the to-be-etched layer.

19. The semiconductor structure according to claim 18, wherein:
the to-be-etched layer includes one of a single-layer structure and a multilayer structure.

* * * * *